United States Patent
Kwong (10) Patent No.: US 6,366,124 B1
(45) Date of Patent: Apr. 2, 2002

(54) BIDIRECTIONAL ACTIVE VOLTAGE TRANSLATOR WITH BOOTSTRAP SWITCHES FOR MIXED-SUPPLY VLSI

(75) Inventor: David Kwong, Fremont, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 09/681,651

(22) Filed: May 16, 2001

(51) Int. Cl.[7] .................. H03K 19/0175; H03K 19/094
(52) U.S. Cl. ............................ 326/81; 326/88; 327/536
(58) Field of Search ................... 326/88, 82, 83, 326/80, 81, 68; 327/536; 365/189.11; 363/60

(56) References Cited

U.S. PATENT DOCUMENTS

| | | | |
|---|---|---|---|
| 5,321,324 A | 6/1994 | Hardee et al. | 307/475 |
| 5,680,063 A | 10/1997 | Ludwig et al. | 326/80 |
| 5,786,711 A * | 7/1998 | Choi | 326/83 |
| 5,821,799 A | 10/1998 | Saripella | 327/333 |
| 5,896,044 A | 4/1999 | Walden | 326/80 |
| 5,963,054 A | 10/1999 | Cochran et al. | 326/68 |
| 6,087,880 A | 7/2000 | Takagi | 327/333 |
| 6,107,832 A | 8/2000 | Taniguchi | 326/81 |
| 6,114,875 A * | 9/2000 | Gerber et al. | 326/80 |
| 6,114,876 A | 9/2000 | Kwong et al. | 326/81 |
| 6,122,273 A | 9/2000 | Cantwell et al. | 370/359 |
| 6,154,057 A | 11/2000 | Shao et al. | 326/63 |
| 6,163,179 A | 12/2000 | Huang et al. | 327/108 |
| 6,212,402 B1 | 4/2001 | Rubbmark et al. | 455/557 |
| 6,242,949 B1 * | 6/2001 | Wilford | 326/81 |
| 6,242,962 B1 * | 6/2001 | Nakamura | 327/333 |

* cited by examiner

*Primary Examiner*—Michael Tokar
*Assistant Examiner*—Daniel D. Chang
(74) *Attorney, Agent, or Firm*—Stuart T. Auvinen (57) ABSTRACT

A voltage translator programmably converts signals generated from a first power-supply voltage to a second power-supply voltage, or vice-versa. In response to control signals, bootstrap switches connect either the first or second power supply to a first internal supply, and either the second or first power supply to a second internal supply. A pair of inverters are sourced by the first power supply and generate true and complement data signals. Cross-coupled p-channel load transistors are sourced by the second internal power supply. A differential pair of n-channel transistors have drains connected to the drains of the load transistors, and gates driven by the true and complement data signals. The bootstrap switches use boosted signals above the power-supply voltages to programmably connect full-voltage power supplies to the internal supplies.

12 Claims, 7 Drawing Sheets

BIDIRECTIONAL ACTIVE VOLTAGE TRANSLATOR WITH BOOTSTRAP SWITCHES FOR MIXED-SUPPLY VLSI

BACKGROUND OF INVENTION

This invention relates to voltage translators, and more particularly to active voltage translators for mixed-supply integrated circuits.

Several years ago, most digital integrated circuits (ICs) used a standard 5-volt power supply. More recently reduced power supply voltages such as 3.3 or 3 volts have become more widespread. As smaller transistor channel lengths are used in the semiconductor processes, smaller voltages are able to break down the transistor's conducting channel or other parts of the integrated circuit. Thus lower voltages are need to be used for the more advanced semiconductor processes that use smaller device geometries.

Mixed-supply integrated circuits have become more common. External interfaces to other IC chips may need to operate at a standard voltage, such as 3.3 volts or 2.5 volts. Internally, the IC may use smaller-size transistors that operate at a reduced supply voltage, such as 1.8 volts. The reduced supply allows for smaller channel-length transistors to be used internally, saving space and reducing capacitive loads. Power consumption is also reduced be the lower supply voltage.

More complex mixed-supply chips may have several supply voltages. Input-Output I/O interface blocks may operate with a 2.5-volt supply, while analog blocks use a 3.3-volt supply. Core digital circuits may operate with a 1.8-volt power supply.

Complex systems may have different interfacing voltage requirements. I/O pins that connect to a Peripheral Component Interconnect (PCI) bus or other Application-Specific Integrated Circuit (ASIC) chips may use 3.3-volt signals, while pins that connect to an external memory may operate at 1.8 volts.

Circuits that can convert internal signals from one power-supply voltage to another without drawing any standby current are desirable. Such voltage translators are useful to convert 3.3-volt signals from an interface block to 1.8-volt signals to the core circuits, and to convert 1.8-volt core signals to 3.3-volt signals to the interface blocks. Such voltage translators are useful for converting other signals among a variety of voltage levels.

DETAILED DESCRIPTION

The present invention relates to an improvement in voltage translators. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

Figure 1:
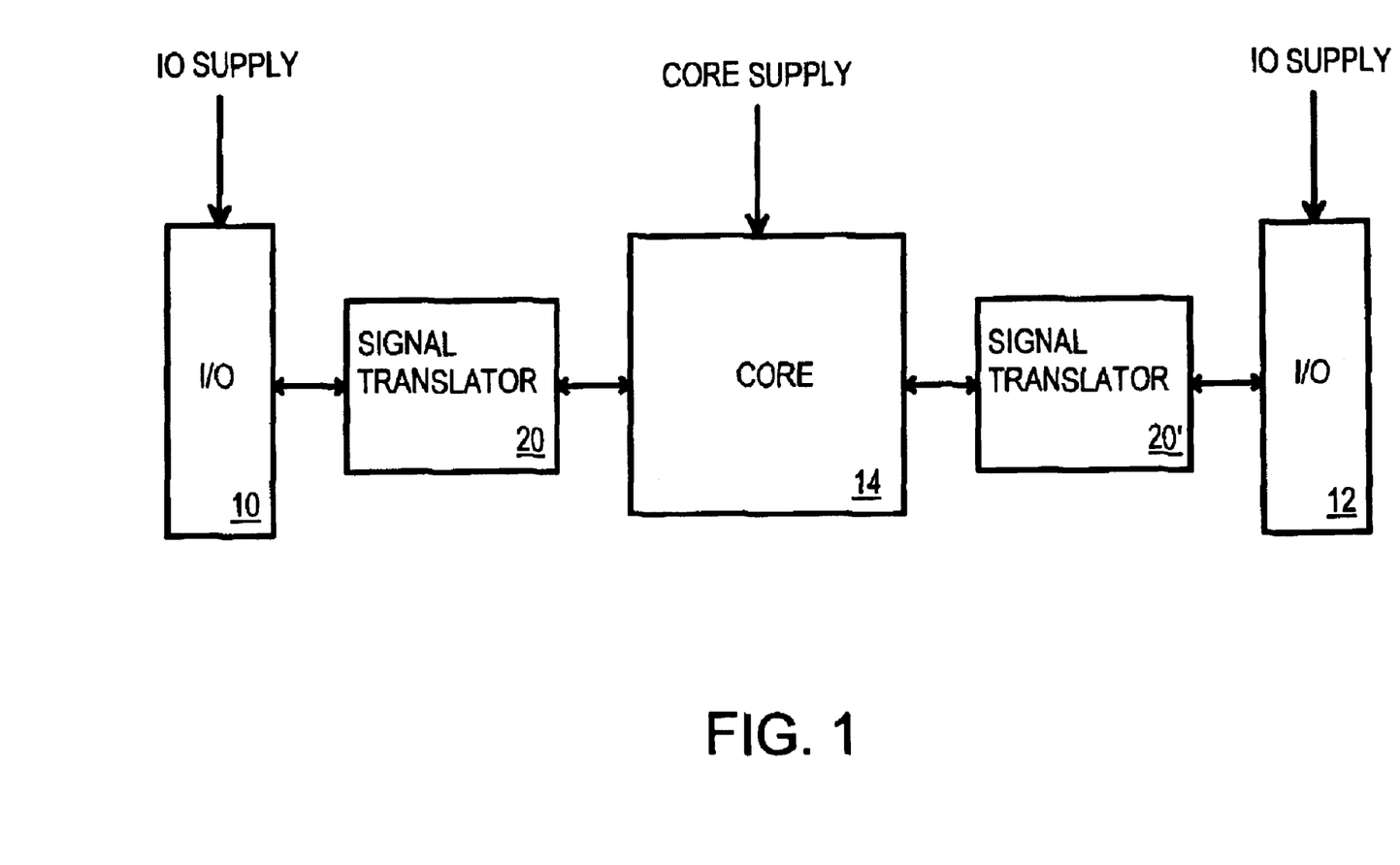
FIG. 1 is a block diagram of a mixed-voltage system with voltage translators.

FIG. 1 is a block diagram of a mixed-voltage system with voltage translators. The system could be split among several different chips, but the voltage translators are especially useful when the blocks shown are integrated onto a single substrate, such as in a very-large-scale-integration (VLSI) chip.

Interface or I/O blocks 10, 12 contain input, output, and bi-directional buffers for interfacing to external signals that connect to other integrated circuits. I/O blocks 10, 12 operate from an I/O power-supply voltage. The signals input to or output from I/O blocks 10, 12 can be full-swing, from 0 (ground) to the I/O supply voltage, or can be reduced, perhaps swinging only a few hundred millivolts, such as those used in low-voltage differential signaling (LVDS) interfaces.

Core 14 contains logic blocks with many transistors that operate at a core voltage supply. Usually this core power supply has a lower voltage than for the I/O supply, reducing power consumption for core 14. Core 14 may include embedded blocks such as memory arrays or computational pipelines.

Signal or voltage translators 20, 20' convert signals from core 14 to I/O blocks 10, 12. Signals in the high logic state are near the power-supply voltage when full complementary metal-oxide-semiconductor (CMOS) voltage levels are used. Voltage translators 20, 20' convert the high voltages from one power-supply voltage to the other. For example, voltage translator 20 converts high signals from I/O block 10 from the I/O supply voltage to the core supply voltage, allowing these signals to be input to core 14 from I/O block 10.

Likewise, signals From core 14 can be converted from the core supply voltage to the I/O supply voltage by voltage translator 20. Since the core supply voltage is usually smaller than the I/O supply voltage, the signal voltage in the high state is stepped up to the higher I/O supply voltage.

Figure 2:
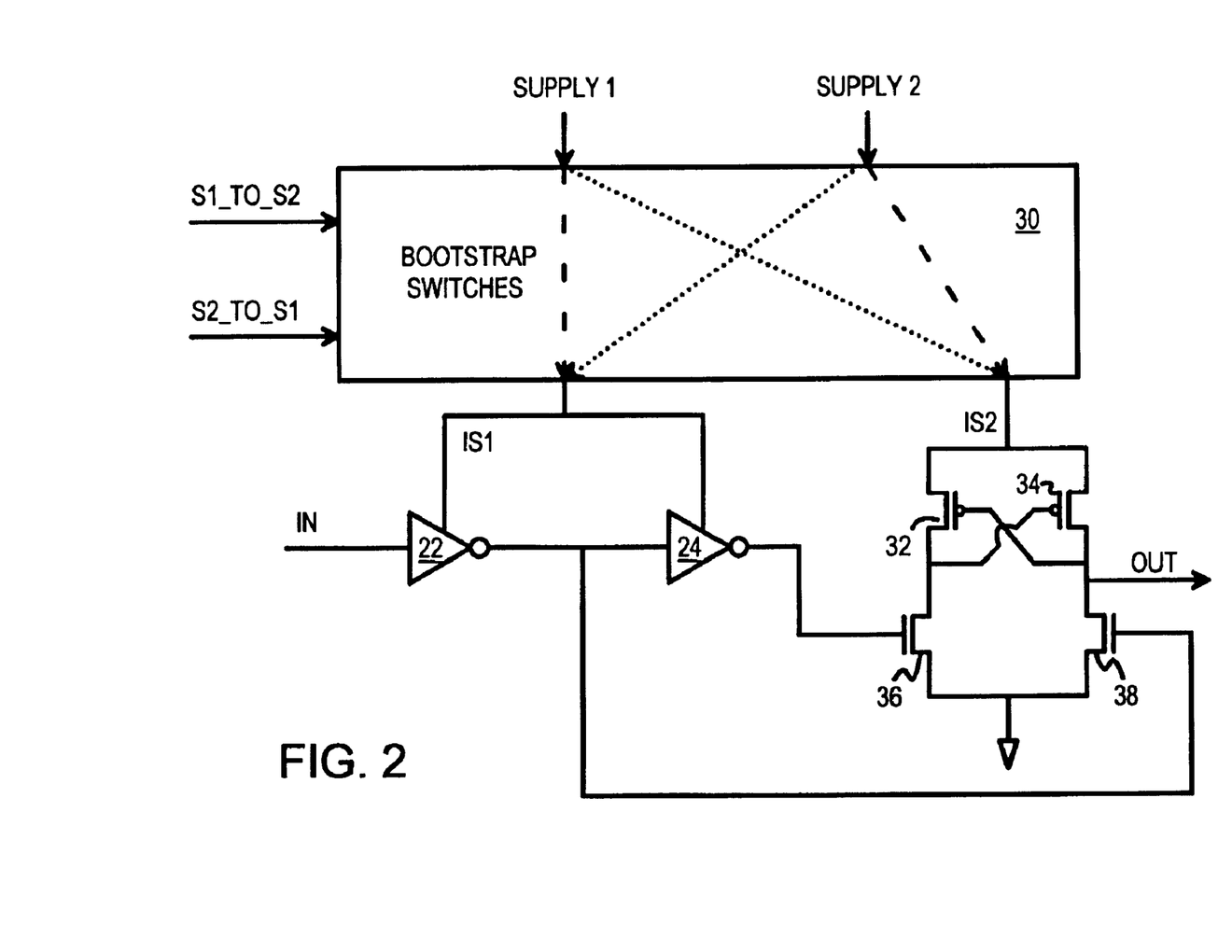
FIG. 2 is a diagram illustrating a voltage translator.

FIG. 2 is a diagram illustrating a voltage translator. A signal IN at one supply is converted to signal OUT at a different supply. Bootstrap switches 30 couple power supplies SUPPLY 1 and SUPPLY 2 to the internal supplies IS1, IS2 for the voltage converter.

Control signal S1_TO_S2 is activated when signal IN is generated from circuits operating at SUPPLY 1 while signal OUT is sent to circuits operating at SUPPLY 2. The voltage converted is then configured to convert signal voltages from supply 1 to supply 2. Control signal S2_TO_S1 is activated when signal IN is generated from circuits operating at SUPPLY 2 while signal OUT is sent to circuits operating at SUPPLY 1. The signals from supply 2 are converted to signals compatible with supply 1. Thus the voltage converter can be programmed to convert signals in either direction.

Programmability is useful because each converter circuit can be programmed to translate 10 voltage levels to core level or core level to IO. Thus the same converter block can be used universally for bi-directional interface applications.

Bootstrap switches 30 contain transistors that act as switch. When control signal S1_TO_S2 is active, bootstrap switched 30 couple SUPPLY 1 to internal supply IS1.

Bootstrap switches 30 then also coupled SUPPLY 2 to internal supply IS2. However, when control signal S2_TO_S1 is active, bootstrap switched 30 couple SUPPLY 1 to second internal supply IS2. Bootstrap switches 30 then also coupled SUPPLY 2 to first internal supply IS1.

Bootstrap switches 30 contain boost circuits that drive the gates of the switch transistors above the power-supply voltages. The boosted gate voltages ensures that the transistors remain in the linear region and thus do not experience the voltage drop of one transistor threshold (Vt) that can occur when transistors operate in the saturated region.

Inverters 22, 24 are coupled to first internal supply IS1. The input signal IN is inverted by inverter 22 to drive the gate of n-channel differential transistor 38 with a signal that swings from ground to the first internal supply voltage. This inverted signal from inverter 22 is again inverted by inverter 24 to drive the gate of n-channel differential transistor 36 with a signal that also swings from ground to the first internal supply voltage.

Since the gates of n-channel differential transistors 36, 38 are driven by opposite signals, in steady-state operation, one gate has a higher voltage than the other and thus conducts more current. For example, when IN is low, then the gate of transistor 38 is higher in voltage than the gate of transistor 36. The gate of transistor 38 is at the supply voltage IS1, while the gate of transistor 36 is driven to ground. More current is conducted through transistor 38, lowering its drain voltage, which is the output OUT. Less current is conducted by transistor 36, causing its drain voltage to rise. When transistor 36 turns off, its drain voltage is pulled up to the power-supply voltage by p-channel transistor 32.

The lower drain voltage on transistor 38 is cross-coupled to the gate of p-channel transistor 32, which conducts more current, causing its drain to rise further in voltage. Likewise, the higher drain voltage on transistor 36 is cross-coupled to the gate of p-channel transistor 34, causing p-channel transistor 34 to conduct less current or even turn off. This further lowers the drain voltage of transistor 38.

The cross-coupling to p-channel transistors 32, 34 adds positive feedback, enhancing the voltage shifts caused by differential transistors 36, 38. When inverters 22, 24 completely drive the gates of differential transistors 36, 38 to power and ground, the grounded-gate differential transistor completely shuts off. The other differential transistor is on strongly and pulls its drain toward ground.

The drain of the grounded-gate differential transistor is pulled up to the second power-supply voltage IS2 through the p-channel transistor. This drain voltage can reach all the way up to the second power-supply voltage since the gate of the p-channel transistor is pulled to ground by the other differential transistor. Thus the high level of the cross-coupled buffer is driven to the second internal power-supply voltage IS2.

The output OUT of the cross-coupled buffer is driven fully to ground or the second internal power-supply voltage IS2. Cross-coupled p-channel transistors 32, 34 restore the high level to voltage IS2, even when IS2 is higher than IS1.

Only one direction for one signal of voltage translator 20 is shown. Additional inverters 22, 24 and cross-coupled buffers can be added for each signal to be converted. For signals in the reverse direction, additional inverters can be added that operate from internal supply IS2 that drive additional cross-coupled buffers that operate from internal supply IS1. These additional inverters and cross-coupled buffers can share the same internal supplies IS1, IS2, and can thus share the same bootstrap switches 30. The voltage converter can easily be made to invert by swapping the connection to the gates of differential transistors 36, 38, or by taking the output from the other leg of the cross-coupled buffer. Furthermore, all transistor paths to ground are properly shut off at steady state. Thus the voltage translator does not draw any standby current.

Figure 3:
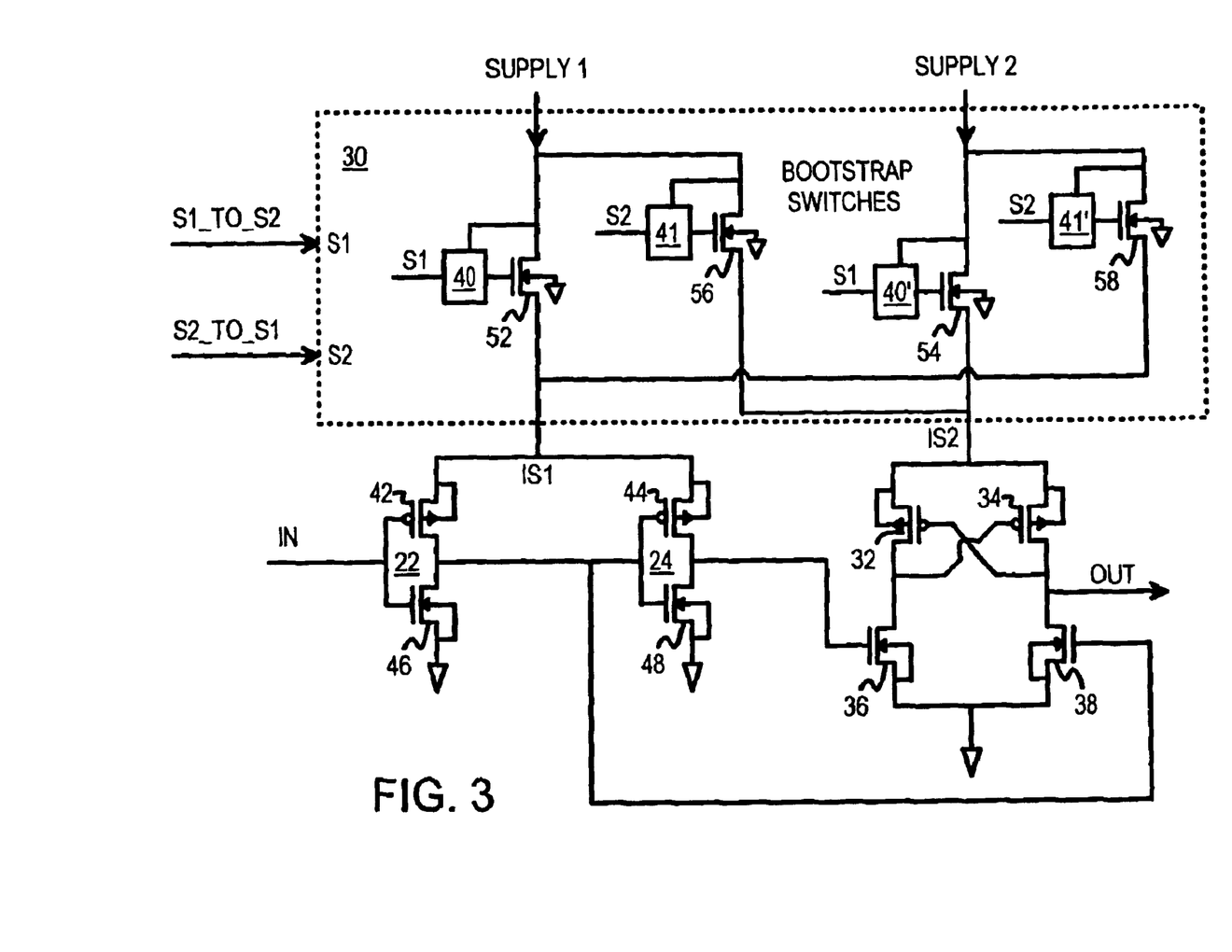
FIG. 3 shows the voltage converter in more detail.

FIG. 3 shows the voltage converter in more detail. Inverter 22 contains p-channel transistor 42 and n-channel transistor 46. Inverter 24 contains p-channel transistor 44 and n-channel transistor 48. The sources and substrates of p-channel transistors 42, 44 are coupled to the first internal supply voltage IS1, which is programmably generated by bootstrap switches 30. The sources and substrates of n-channel transistors 46, 48 are grounded.

For the cross-coupled buffer, n-channel differential transistors 36, 38 also have grounded sources and substrates, while cross-coupled p-channel transistors 32, 34 have their sources and substrates (well-taps) connected to the second internal power supply IS2.

Bootstrap switches 30 generates first internal supply IS1 to inverters 22, 24, and second internal supply IS2 to the cross-coupled buffer. SUPPLY 1 is switched to the first internal supply IS1 by n-channel switch transistor 52, or to second internal supply IS2 by n-channel switch transistor 56. Likewise, SUPPLY 2 is switched to the first internal supply IS1 by n-channel switch transistor 58, or to second internal supply IS2 by n-channel switch transistor 54.

Control signal S1_TO_S2 (SI) turns on n-channel switch transistors 52, 54, causing SUPPLY 1 to be connected to first internal supply IS1, and SUPPLY 2 to be connected to second internal supply IS2. Control signal S2_TO_S1 (S2) turns on n-channel switch transistors 56, 58, causing SUPPLY 1 to be connected to second internal supply IS2, and SUPPLY 2 to be connected to first internal supply IS1. Only one of S1_TO_S2 or S2_TO_S1 is activated at any time.

Bootstrap drivers 40, 40', 41, 41' boost the gate voltages at least a threshold above their respective power-supplies SUPPLY 1 or SUPPLY 2. This boot in gate voltage ensures that switch transistors 52, 54, 56, 58 operate in the linear region, preventing a Vt voltage drop to the internal supplies IS1, IS2. The substrates of switch transistors 52, 54, 56, 58 can be grounded.

Figure 4:
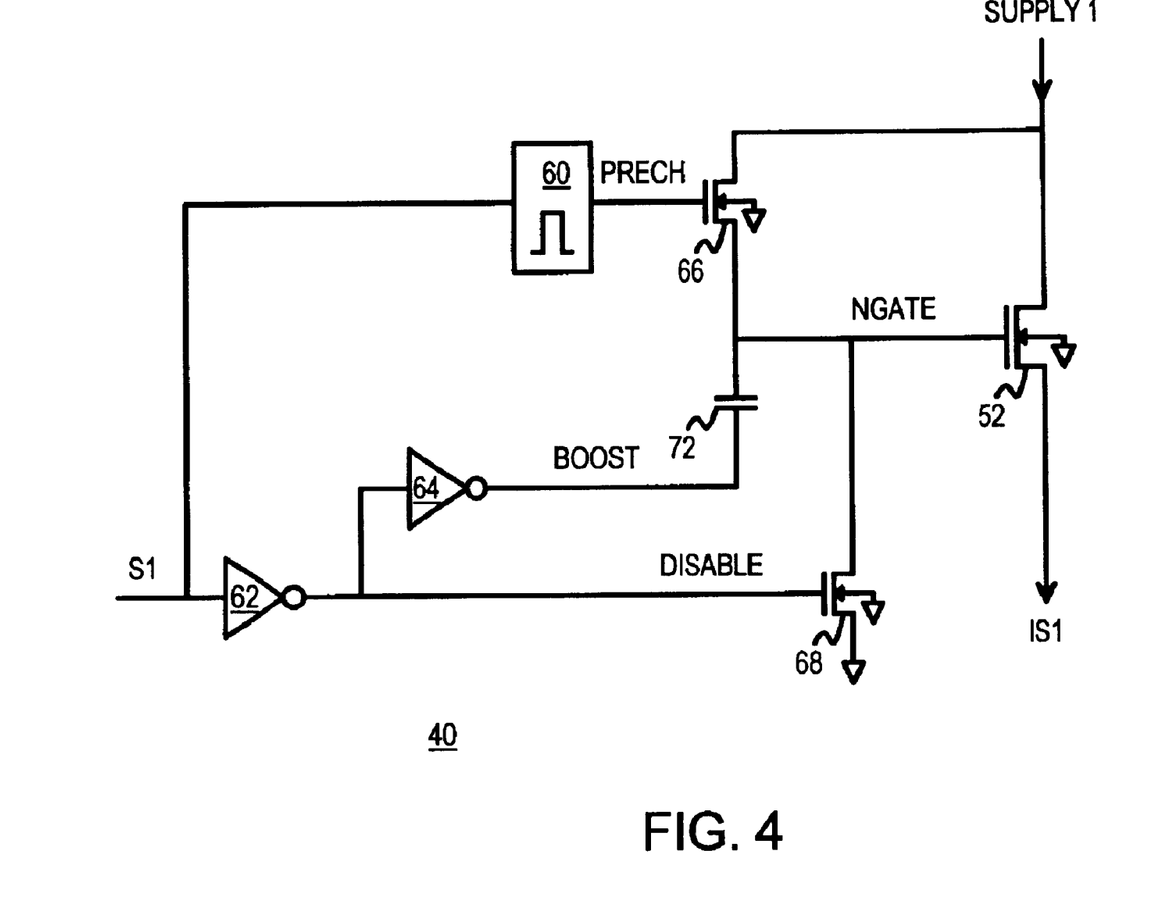
FIG. 4 shows a bootstrap driver driving the gate of a switch transistor.

FIG. 4 shows a bootstrap driver driving the gate of a switch transistor. Bootstrap driver 40 drives the gate of n-channel switch transistor 52 to a voltage above SUPPLY 1 when control signal S1 is activated.

When control signal S1 is off (low), inverter 62 drives DISABLE high. DISABLE is the gate of n-channel disable transistor 68, which turns on, discharging capacitor 72 and node NGATE to ground. The low on control signal S1 keeps signal PRECH low, keeping n-channel precharge transistor 66 off. The low NGATE keeps n-channel switch transistor 52 off, disconnecting SUPPLY 1 from internal supply IS1.

When control signal S1 transitions from low to high, inverter 62 drives DISABLE low, turning off disable transistor 68. Pulse generator 60 generates a high-going pulse on signal PRECH, pulsing n-channel precharge transistor 66 on and then off again. Precharge transistor 66 couples power supply SUPPLY 1 to node NGATE, charging capacitor 72. Signal BOOST is still low.

After the precharge pulse ends, inverter 64 drives BOOST high, driving the lower plate of capacitor 72 high. Since the upper plate of capacitor 72 is already precharged high, the rise in the voltage of signal BOOST is coupled to node NGATE, driving NGATE higher in voltage, above SUPPLY 1.

Figure 5:
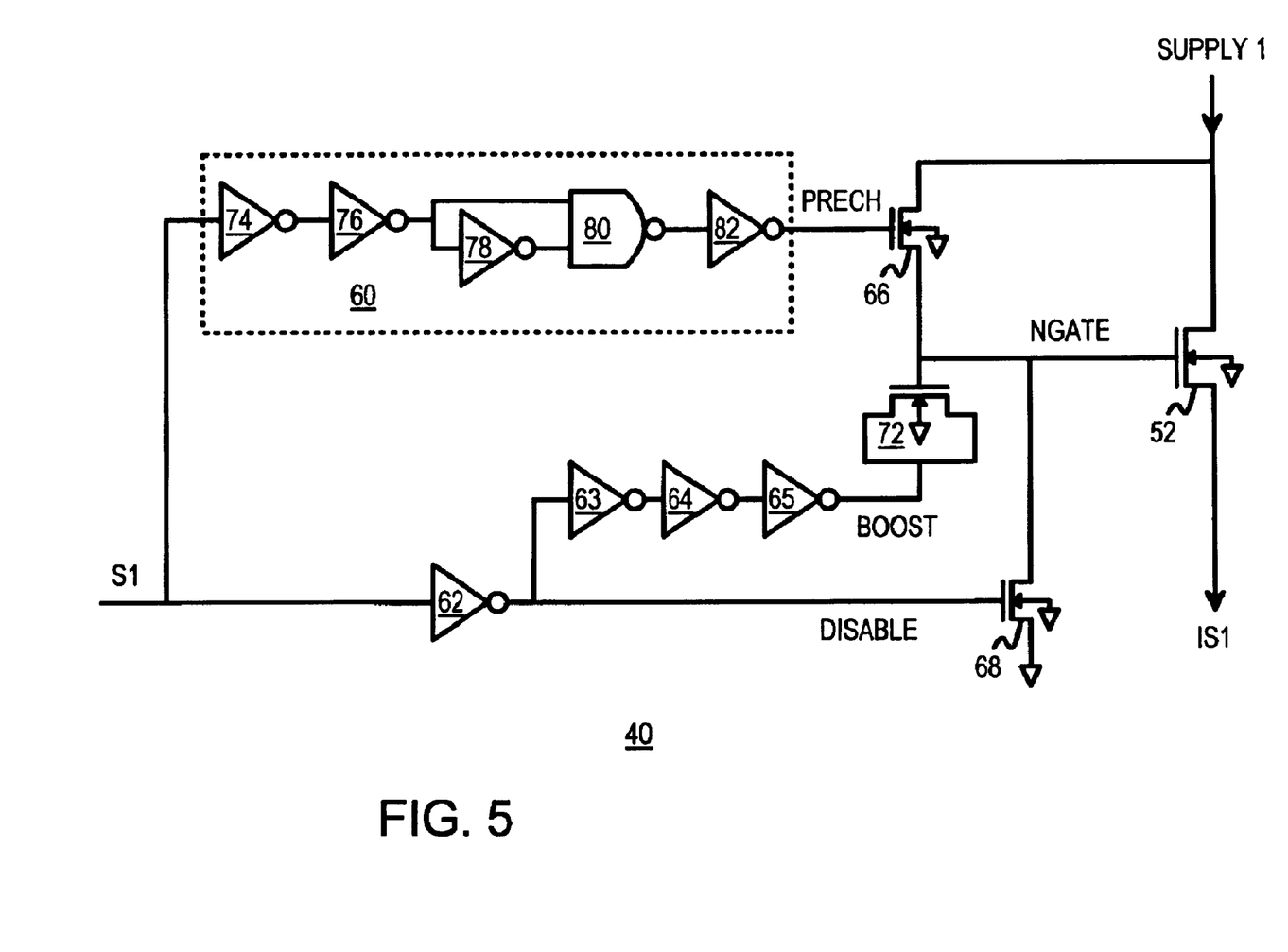
FIG. 5 is a more detailed diagram of the bootstrap driver driving the gate of the switch transistor.

FIG. 5 is a more detailed diagram of the bootstrap driver driving the gate of the switch transistor. Inverters 63, 64, 65 delay signal BOOST, allowing the precharge pulse to occur first. Slow transistors can be used for inverters 63, 64, 65 so that the delay through pulse generator 60 is shorter than the delay through inverters 63, 64, 65.

Pulse generator 60 generates a short pulse caused by inverter 78 to one input of NAND gate 80, while the other input receives the non-inverted input from inverters 74, 76. When both inputs to NAND gate 80 are high, the pulse on signal PRECH is generated by inverter 82. When the high propagates through inverter 78, the pulse ends. Thus the pulse width is determined by the delay through inverter 78.

Capacitor 72 can be implemented by an n-channel transistor with its gate connected to node NGATE, and its source and drain coupled together and to node BOOST. Its substrate can be grounded, as can the substrates of n-channel transistors 66, 68.

Figure 6:
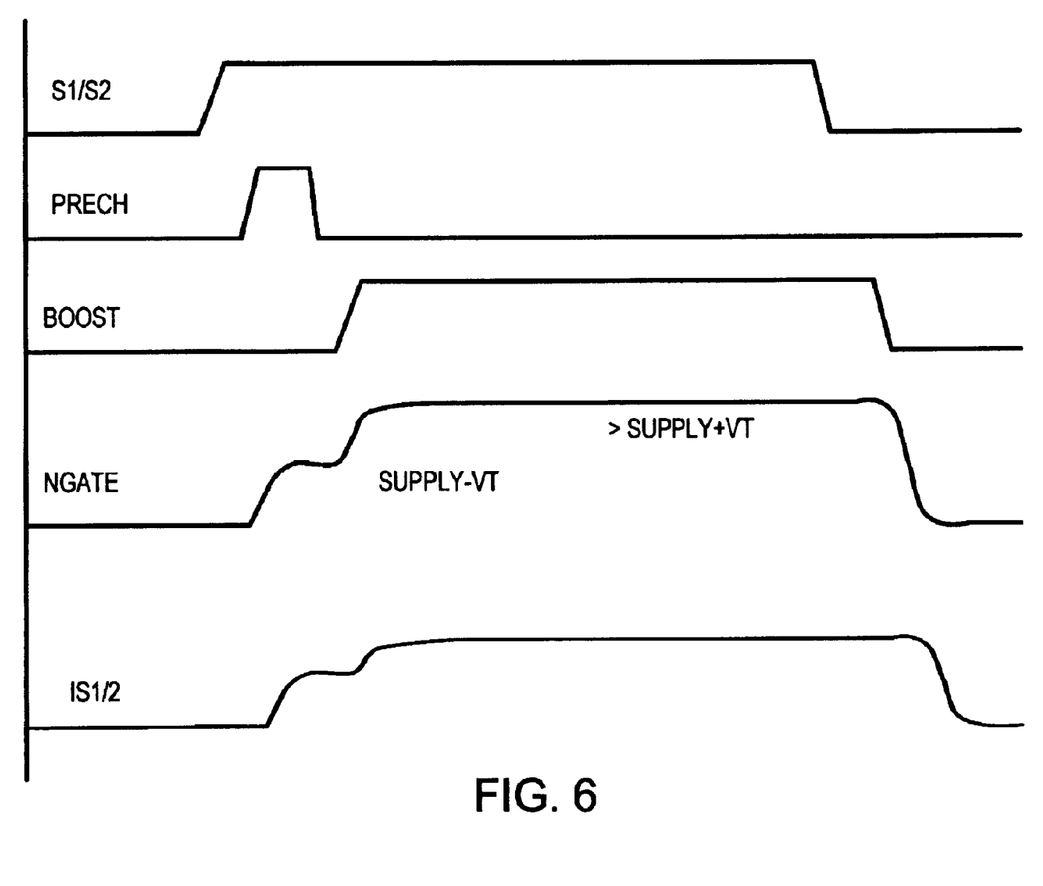
FIG. 6 shows waveforms for the bootstrap switches.

FIG. 6 shows waveforms for the bootstrap switches. When control signal S1 (or S2) goes high, the precharge pulse is generated. The precharge pulse precharges the capacitor and turns on the switch transistor. However, since the gate node NGATE is precharged only to a threshold below SUPPLY 1, SUPPLY-Vt, the switch transistor is saturated and can only partially drive the internal supply IS1 (or IS2).

After the precharge pulse ends, the precharge transistor turns off, isolating node NGATE. Then the BOOST signal is driven high, boosting node NGATE higher in voltage. The amount of voltage rise depends on the capacitive coupling ratio, which depends on the capacitance of capacitor 72 and the parasitic and other capacitances on node NGATE. However, the capacitor can be designed to be sufficiently large so that the voltage of NGATE is driven up to at least a threshold above the supply voltage, >SUPPLY+Vt.

The boosted voltage on node NGATE fully turns on the switch transistor, which can drive the internal supply IS1 or IS2 up to the supply voltage SUPPLY 1 or 2. Very little voltage drop occurs across the switch transistor since it is in the linear region or operation.

Figure 7A:
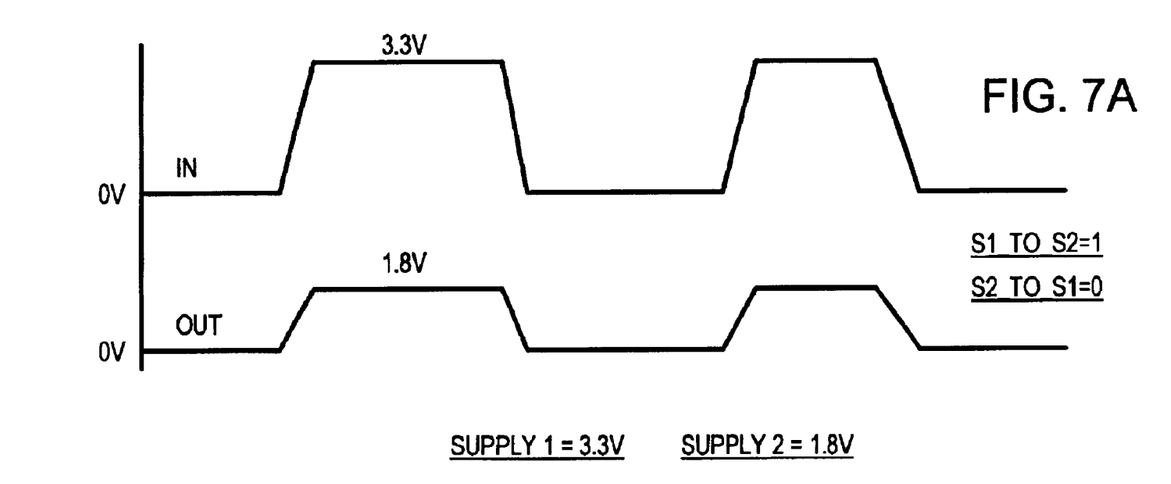
FIGS. 7A, 7B show signal waveforms for the voltage translator.

In FIG. 7A, control signal S1_TO_S2 is high, causing the bootstrap switches to coupled SUPPLY 1 to IS1 and SUPPLY 2 to IS2.

Figure 7B:
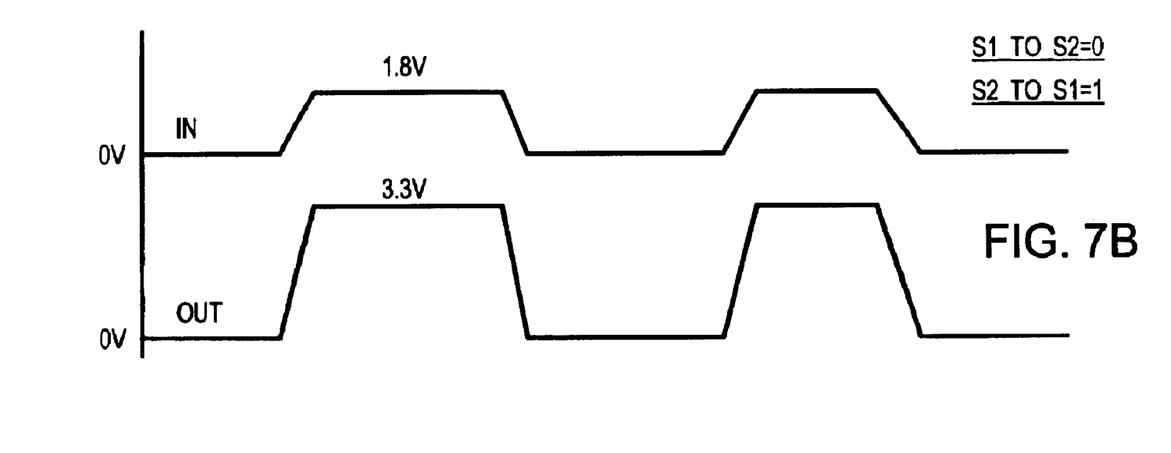

FIGS. 7A, 7B show signal waveforms for the voltage translator. In FIG. 7A, control signal S1_TO_S2 is high, causing the bootstrap switches to coupled SUPPLY 1 to IS1 and SUPPLY 2 to IS2. In this example SUPPLY 1 is 3.3 volts, while SUPPLY 2 is 1.8 volts. SUPPLY 1 could be the I/O supply while SUPPLY 2 is the core power supply.

When the input signal IN switches to the high logical state at about 3.3 volts, the voltage converter drives the output signal OUT high to 1.8 volts. When input signal IN is low at ground, OUT is also driven to ground. Thus a 3.3-volt signal is converted to a 1.8-volt signal.

In FIG. 7B, control signal S2_TO_S1 is high while S1_TO_S2 is low, causing the bootstrap switches to coupled SUPPLY 1 to IS2 and SUPPLY 2 to IS1. In this example SUPPLY 1 is 3.3 volts, while SUPPLY 2 is 1.8 volts.

When the input signal IN switches to the high logical state at about 1.8 volts, the voltage converter drives the output signal OUT high to 3.3 volts. When input signal IN is low at ground, OUT is also drive to ground. Thus a 1.8-volt signal is converted to a higher 3.3-volt signal.

ALTERNATE EMBODIMENTS

Several other embodiments are contemplated by the inventors. For example different supply voltages can be applied. The bootstrap switches can be expanded to select from among three or more supply voltages to apply to the two buffer stages, the input inverters and the cross-coupled buffer. Additional inverters can be used in the input stage, or just a single inverter. Likewise, additional buffers can be added to the output stage after the cross-coupled buffer. Many different combinations of transistor sizes can be used. Thicker gate oxides can be used for transistors in blocks having higher supply voltages. These thicker-oxide transistors can be used for both stages and all bootstrap switches in the voltage translators. The two control inputs could be generated from a single control input, or a single control signal could be used. Other kinds and variations of transistors could be substituted for the p-channel and n-channel CMOS transistors.

The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. 37 C.F.R. §1.72(b). Any advantages and benefits described may not apply to all embodiments of the invention. When the word 'means' is recited in a claim element, Applicant intends for the claim element to fall under 35 USC §112, paragraph 6. Often a label of one or more words precedes the word 'means'. The word or words preceding the word 'means' is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word means are not intended to fall under 35 USC §112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A voltage translator comprising:

a first power-supply input;

a second power-supply input, the second power-supply input connected to a different power-supply voltage than the first power-supply input;

a control input; supply switches, responsive to the control input, for connecting the first power-supply input to an input-stage internal supply and for connecting the second power-supply input to an output-stage internal supply in response to a first state of the control input, but for connecting the second power-supply input to the input-stage internal supply and for connecting the first power-supply input to the output-stage internal supply in response to a second state of the control input;

an input stage having an inverter for generating a complement data signal from a true data signal, the inverter being powered by the input-stage internal supply;

a cross-coupled buffer comprising:

a pair of cross-coupled load transistors coupled to the output-stage internal supply;

a pair of differential transistors, coupled to receive current from the pair of cross-coupled load transistors, the pair of differential transistors having gates coupled to the true and complement data signals from the input stage; and an output signal, driven by a node between one of the pair of cross-coupled load, transistors and one of the pair of differential transistors;

wherein the supply switches comprise a plurality of switches, each switch comprising:

an n-channel switch transistor for conducting current from a supply input to an internal supply in response to a control gate;

a capacitor, coupled to the control gate, for driving a voltage on the control gate to a boosted voltage above a voltage of the supply input;

a precharge transistor for connecting the supply input to the control gate in response to a precharge pulse;

a pulse generator for generating the precharge pulse;

wherein the output signal switches from a ground to a full voltage of the second power-supply input when the control input is in the first state and the true or the complement data signal switches between ground and a fill voltage of the first power-supply input, whereby full voltage levels are output and whereby power supplies are selectably connected to the input stage and the cross-coupled buffer by the supply switches in response to the control input.

2. The voltage translator of claim 1 wherein the control gate is boosted to a voltage at least a transistor-threshold above the voltage of the supply input.

3. The voltage translator of claim 2 wherein the n-channel switch transistor operates in a linear mode.

4. The voltage translator of claim 3 wherein each switch has a control input that activates the pulse generator to generate the precharge pulse and drives a boost signal to the capacitor in response to an activating transition of the control input.

5. The voltage translator of claim 4 wherein each switch further comprises:

a discharge transistor, coupled to discharge the control gate and the capacitor in response to a de-activating transition of the control input.

6. The voltage translator of claim 5 wherein the input stage also has a first inverter that drives an input to the inverter, the first inverter and the inverter each having a p-channel source transistor with sources coupled to the input-stage internal supply.

7. The voltage translator of claim 6 wherein the pair of cross-coupled load transistors comprise a first p-channel transistor and a second p-channel transistor each with sources coupled to the output-stage internal supply;

wherein the pair of differential transistors comprises a first n-channel transistor and a second n-channel transistor each with grounded sources;

wherein a drain of the first p-channel transistor is coupled to a drain of the first n-channel transistor, and a drain of the second p-channel transistor is coupled to a drain of the second n-channel transistor.

8. The voltage translator of claim 7 wherein a gate of the first p-channel transistor is coupled to the drain of the second p-channel transistor, and a gate of the second p-channel transistor is coupled to the drain of the first p-channel transistor.

9. A signal-voltage translator comprising:

a first power-supply input for receiving a first power-supply voltage;

a second power-supply input for receiving a second power-supply voltage;

a first switch connected between the first power-supply input and an input supply;

a second switch connected between tee second power-supply input and the input supply;

a third switch connected between the first power-supply input and an output supply;

a fourth switch connected between the second power-supply input and tile output supply;

an input buffer, coupled to the input supply but not to the output supply, the input buffer outputting a second data signal generated from a first data signal;

a cross-coupled buffer comprising:

a first load transistor having a channel between the output supply and a first node, the channel controlled by a gate connected to a second node;

a second load transistor having a channel between the output supply and a second node, the channel controlled by a gate connected to the first node;

a first differential transistor having a channel between the first node and a ground, the channel controlled by a gate connected to the first data signal; and a second differential transistor having a channel between the second node and the ground, the channel controlled by a gate connected to the second data signal;

a first control input for activating the first and fourth switches but not activating the second and third switches when an input applied to the input buffer is generated by a circuit powered from the first power-supply voltage and the output is sent to a circuit powered by the Second power-supply voltage;

a second control input for activating the second and third switches but not activating the first and fourth switches when an input applied to the input buffer is generated by a circuit powered from the second power-supply voltage and the output is sent to a circuit powered by the first power-supply voltage, whereby the first or second node is an output that swings from ground to a voltage of the output supply.

10. The signal-voltage translator of claim 9 wherein the first switch comprises:

a switch transistor coupled between the first power-supply voltage and the input supply;

a gate node that controls the switch transistor;

a boost buffer that generates a boost signal in response to the first control input;

a capacitor coupled between the boost signal and the gate node;

a pulse generator for generating a precharge pulse before the boost signal is generated in response to an activating edge of the first control input;

a precharge transistor that connects the first power-supply voltage to the gate node when the precharge pulse is generated;

a discharge transistor that connects the gate node to ground when the first control input is inactive.

11. The signal-voltage translator of claim 10 wherein the switch transistor, the precharge transistor, and the discharge transistor are n-channel transistors.

12. The signal-voltage translator of claim 9 wherein the first and second load transistors are p-channel transistors and the first and second differential transistors are n-channel transistors.

* * * * *